United States Patent
Sharan et al.

(10) Patent No.: US 6,429,071 B1
(45) Date of Patent: *Aug. 6, 2002

(54) METHOD OF INCREASING CAPACITANCE OF MEMORY CELLS INCORPORATING HEMISPHERICAL GRAINED SILICON

(75) Inventors: Sujit Sharan; Thomas A. Figura; Anand Srinivasan; Gurtej S. Sandhu, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/481,276

(22) Filed: Jan. 11, 2000

Related U.S. Application Data (63) Continuation of application No. 08/650,916, filed on May 17, 1996, now Pat. No. 6,027,970.

(51) Int. Cl.[7] .......................................... H01L 21/8242
(52) U.S. Cl. ..................... 438/255; 438/398; 438/964
(58) Field of Search .............................. 438/253, 255, 438/396, 398, 964; 257/309

(56) References Cited

U.S. PATENT DOCUMENTS

| | | | |
|---|---|---|---|
| 5,102,832 A | 4/1992 | Tuttle | 438/398 |
| 5,112,773 A | 5/1992 | Tuttle | 438/398 |
| 5,182,232 A | 1/1993 | Chhabra et al. | 438/398 |
| 5,185,282 A | 2/1993 | Lee et al. | 438/253 |
| 5,191,509 A | 3/1993 | Wen | 361/311 |
| 5,202,278 A | 4/1993 | Mathews et al. | 438/398 |
| 5,223,729 A | 6/1993 | Kudoh et al. | 257/296 |
| 5,266,514 A | 11/1993 | Tuan et al. | 438/398 |
| 5,302,233 A | 4/1994 | Kim et al. | 438/692 |
| 5,318,920 A | 6/1994 | Hayashide | 438/398 |
| 5,320,880 A | 6/1994 | Sandhu et al. | 427/578 |
| 5,340,763 A | 8/1994 | Dennison | 438/396 |
| 5,340,765 A | 8/1994 | Dennison et al. | 438/398 |
| 5,342,800 A | 8/1994 | Jun | 438/396 |
| 5,350,707 A | 9/1994 | Ko et al. | 438/396 |

(List continued on next page.)

OTHER PUBLICATIONS

U.S. patent application of Figura—Ser. No. 08/209,659, Filed Mar. 11, 1994 now US 5,696,014.
U.S. patent application of Figura—Ser. No. 08/724,981, Filed Oct. 3, 1996 now US 5,972,771.

*Primary Examiner*—Carl Whitehead, Jr.
*Assistant Examiner*—Toniae M. Thomas
(74) *Attorney, Agent, or Firm*—Knobbe, Martens, Olson & Bear LLP (57) ABSTRACT

Disclosed is a method of increasing capacitance of a memory cell capacitor. A bottom electrode, comprising a hemispherical grained (HSG) silicon layer, is subjected to a dry etch process. The etch tends to separate the individual grains of the HSG silicon, thereby facilitating formation of a uniformly thick capacitor dielectric over the HSG silicon surface. Average thickness of the dielectric may therefore be reduced while maintaining reliability of the memory cell. The described embodiments include HCl/HF vapor etch, and $NF_3$ plasma etch. Both of the preferred embodiments are configured to operate isotropically. Due to precisely controllable etch rates, the dry etch of the present invention is viable for separating grains of HSG silicon layers incorporated into extremely dense circuits (e.g., 64 Mbit DRAM) and correspondingly scaled down circuit dimensions.

27 Claims, 4 Drawing Sheets

U.S. PATENT DOCUMENTS

| | | | |
|---|---|---|---|
| 5,354,705 A | 10/1994 | Mathews et al. | 438/397 |
| 5,366,917 A | 11/1994 | Watanabe et al. | 438/398 |
| 5,372,962 A | 12/1994 | Hirota et al. | 438/398 |
| 5,387,531 A | 2/1995 | Rha et al. | 438/397 |
| 5,405,801 A | 4/1995 | Han et al. | 438/386 |
| 5,407,534 A | 4/1995 | Thakur | 438/398 |
| 5,481,127 A | 1/1996 | Ogawa | 257/308 |
| 5,488,011 A | 1/1996 | Figura et al. | 438/253 |
| 5,489,548 A | 2/1996 | Nishioka et al. | 438/396 |
| 5,492,854 A | 2/1996 | Ando | 438/396 |
| 5,494,841 A | 2/1996 | Dennison et al. | 438/210 |
| 5,597,756 A | 1/1997 | Fazan et al. | 438/398 |
| 5,639,689 A | 6/1997 | Woo | 438/398 |
| 5,696,014 A | 12/1997 | Figura | 438/398 |
| 5,726,085 A * | 3/1998 | Crenshaw et al. | 438/255 |
| 5,753,558 A | 5/1998 | Akram et al. | 438/386 |
| 5,760,434 A | 6/1998 | Zahurak et al. | 257/309 |
| 5,786,250 A | 7/1998 | Wu et al. | 438/254 |
| 5,972,771 A * | 10/1999 | Figura | 438/398 |
| 6,022,775 A * | 2/2000 | Tsai et al. | 438/253 |
| 6,046,084 A * | 4/2000 | Wei et al. | 438/255 |

* cited by examiner

METHOD OF INCREASING CAPACITANCE OF MEMORY CELLS INCORPORATING HEMISPHERICAL GRAINED SILICON

The present application is a continuation of U.S. application Ser. No. 08/650,916, filed May 17, 1996, now U.S. Pat. No. 6,027,970, issued Feb. 22, 2000.

FIELD OF THE INVENTION

The present invention relates to increasing the roughness of hemispherical grain (HSG) silicon surfaces, and more particularly to increasing the capacitance of capacitors in high density dynamic random access memory (DRAM) chips.

BACKGROUND OF THE INVENTION

Recent advances in the miniaturization of integrated circuits have led to smaller chip areas made available for devices. High density dynamic random access memory chips (DRAMs), for example, leave little room for the storage node of a memory cell. Yet, the storage node (capacitor) must be able to store a certain minimum charge, determined by design and operational parameters, to ensure reliable operation of the memory cell. It is thus increasingly important that capacitors achieve a high stored charge storage per unit area of the wafer. Accordingly, several techniques have been recently developed to increase the total charge capacity of the cell capacitor without significantly affecting the chip area occupied by the cell.

Traditionally, capacitors integrated into memory cells have been patterned after the parallel plate capacitor. An interelectrode dielectric material is deposited between two conductive layers, which form the capacitor plates or electrodes. The amount of charge stored on the capacitor is proportional to the capacitance, $C = \epsilon \epsilon_0 A/d$, where $\epsilon$ is the dielectric constant of the capacitor dielectric, $\epsilon_0$ is the vacuum permittivity, A is the electrode area, and d represents the spacing between electrodes. Some techniques for increasing capacitance therefore include the use of new materials characterized by high dielectric constants.

Other techniques concentrate on increasing the effective surface area of the electrodes by creating folding structures such as trench or stacked capacitors. Such structures better utilize the available chip area by creating three dimensional shapes to which the conductive plates and capacitor dielectric conform. For example, U.S. Pat. No. 5,340,765, issued to Dennison et al. and assigned to the assignee present invention, discloses a process for forming capacitor structures resembling cylindrical containers. A polycrystalline silicon (polysilicon) container is first formed, both the inside and outside surfaces of which are available for use as the bottom electrode. More complex structures, such as the container-within-container and multiple pin structures disclosed in U.S. Pat. No. 5,340,763, issued Aug. 23, 1994 to Dennison, may further increase electrode surface area and allow the extension of conventional fabrication materials to future generation memory devices. The capacitor dielectric and top electrode may then be successively deposited.

Electrode surface area may also be increased by providing a high surface area, rough texture to the electrode surface. One class of methods for providing rough electrode surfaces involves roughening polysilicon layers with preferential etch techniques. For example, U.S. Pat. No. 3,405,801, issued to Han et al., discloses a method of roughening a polysilicon layer by selectively etching at grain boundaries. Alternatively, U.S. Pat. No. 5,372,962, issued to Hirota et al., describes various selective etch processes for perforating a polysilicon layer.

Another class of electrode roughening techniques involves texturizing a conductive layer by formation of hemispherical grained (HSG) silicon. HSG silicon may be formed by a number of different methods, including gas phase nucleation and surface seeding. An extremely thin layer of oxide, for example, may serve as a seed layer for HSG growth to follow. Native oxide is allowed to grow over a previously deposited silicon layer. Polysilicon may then be deposited by low pressure chemical vapor deposition (LPCVD), and silicon grains grow preferentially about nucleation sites provided by the native oxide. Alternatively, nucleation sites may be provided by the deposition of dispersed particles as disclosed by U.S. Pat. No. 5,102,823, issued to Tuttle. In either case, during the initial stages of polysilicon deposition, the presence of these nucleation sites causes the formation of polysilicon nodules. During later stages of deposition, polysilicon will continue to coat the previously created nodules, resulting in stable, hemispherical polysilicon grains.

Figure 1:
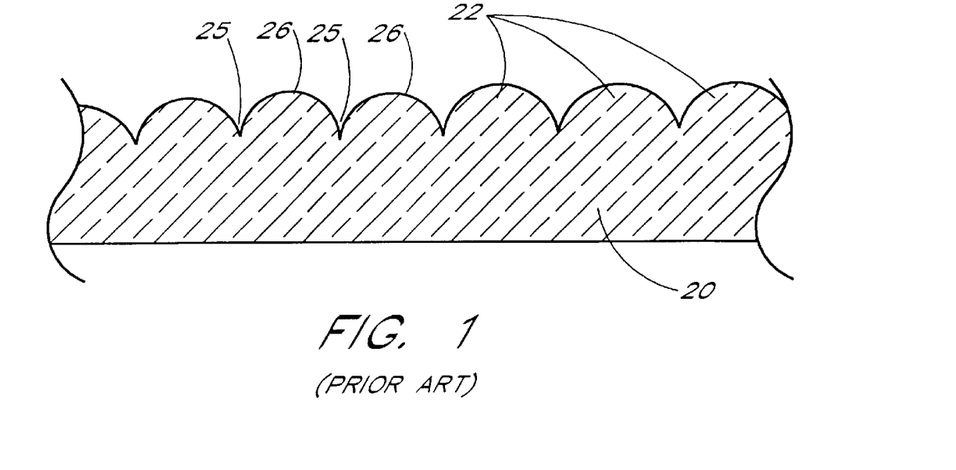
FIG. 1 is a schematic, cross-sectional representation of a layer of hemispherical grain (HSG) silicon, constructed in accordance with the prior art.

FIG. 1 is an exaggerated, close-up view of an HSG silicon layer 20 formed by an alternative, vacuum anneal process. A silicon layer is deposited and annealed at a critical temperature and pressure, inducing surface migration of silicon atoms. U.S. Pat. No. 5,407,534 issued to Thakur, for example, discloses one set of deposition and anneal parameters by which HSG silicon may be formed. Relatively large, hemispherical grains form by this redistribution, and the resultant HSG silicon layer 20 provides a much larger electrode surface area than planar polysilicon. As shown, the HSG silicon layer 20 is substantially contiguous, such than individual grains 22 tend to intersect one another. A capacitor dielectric may then be formed over the HSG silicon 20, and a conductive layer for the top electrode is deposited, in turn, over the capacitor dielectric.

While dielectric thickness ("d" of the capacitance formula set forth above) should be minimized in order to maximize capacitance, too thin a capacitor dielectric risks leakage current across the capacitor electrodes. Leakage current may result from pinholes in the dielectric and quantum tunneling effects, both of which phenomena are more likely to occur with thinner dielectrics. Thin capacitor dielectric layers are thus characterized by a low breakdown voltage, limiting the charge which may be stored on the bottom electrode before breakdown leakage occurs. Accordingly, capacitor dielectric layers may be characterized by a certain minimal thickness necessary to avoid breakdown, depending upon the selected dielectric material. Where the dielectric comprises silicon nitride ($Si_3N_4$), for example, the layer should be at least about 50 Å.

Figure 2:
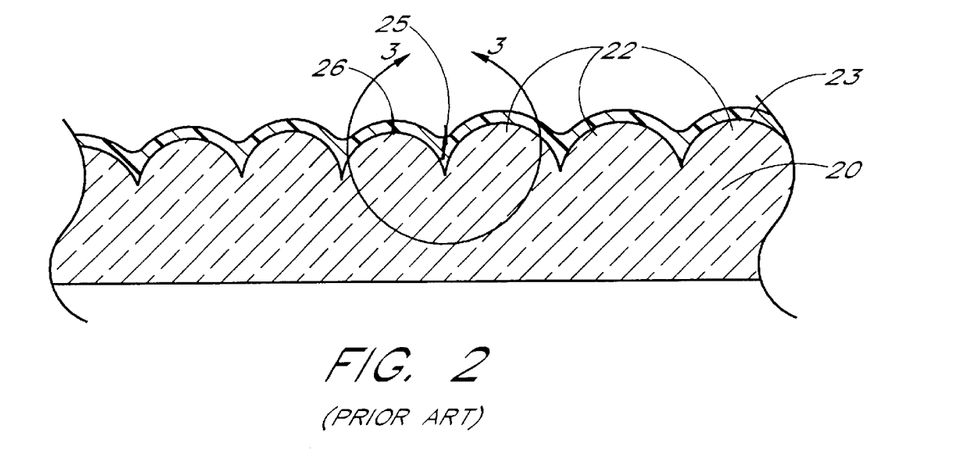
FIG. 2 illustrates the HSG layer of FIG. 2 after the deposition of a capacitor dielectric layer, in accordance with the prior art.

FIG. 2 illustrates the HSG silicon 20 of FIG. 1 after a capacitor dielectric layer 23 has been deposited thereupon. The individual grains 22 of the HSG silicon 20 tend to intersect one another as illustrated, such that dielectric bridging occurs between grains, creating thicker dielectric between grains than over grain surfaces. The close-up view of FIG. 3 more clearly illustrates the discrepancy in dielectric 23 thickness in the boundary area 25 between individual hemispherical grains 22, and that over an upper surface area 26 of individual grains 22. The dielectric 23 of the boundary area 25 may reach twice as thick as the dielectric 23 in other areas, gradually reducing in thickness as the mouth of the boundary area widens.

Figure 3:
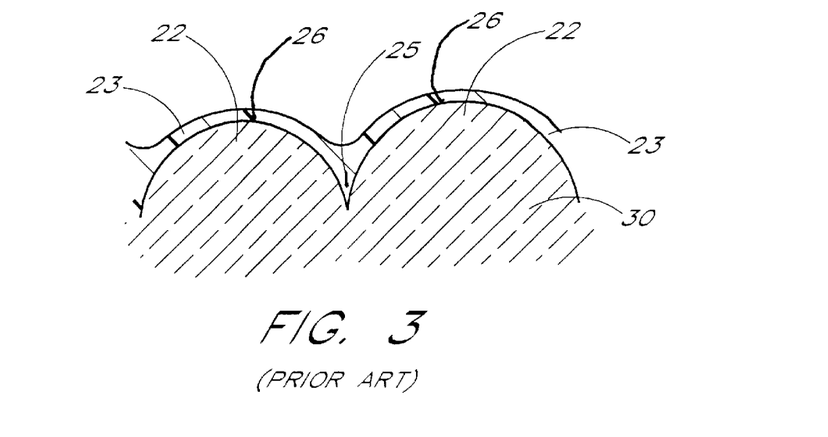
FIG. 3 illustrates a close-up view of the HSG layer and dielectric layer of FIG. 2.

If the dielectric 23 is deposited to the minimal thickness (e.g., 50–70 Å of $Si_3N_4$) in a boundary area 25, the dielectric 23 overlying the grains 22 will be too thin and lead to breakdown and operational data errors. Alternatively, when the dielectric 23 is deposited to the minimal thickness over HSG silicon grains, the dielectric of the boundary area 25 is too thick, leading to reduced capacitance and leaving too little room for conformal deposition (without voids or keyholes) of the top electrode material within the stacked capacitor. Too little capacitance for the memory cell may also lead to a high rate of soft data errors.

Accordingly, a need exists for a method of providing conformal dielectric layers for memory cell capacitors while maintaining high capacitance for the memory cell.

SUMMARY OF THE INVENTION

In accordance with one aspect of the present invention, a method is provided for fabricating a capacitor for an integrated circuit memory cell. The method comprises forming a layer of hemispherical grained (HSG) silicon for a bottom electrode structure in electrical contact with a circuit node. The individual grains of the HSG silicon are then separated from one another by dry etching the HSG silicon. A capacitor dielectric layer is then formed, substantially conformal with the etched HSG silicon layer. A top electrode is then deposited over the capacitor dielectric to complete the integrated capacitor.

In accordance with another aspect of the present invention, a method is provided for separating substantially contiguous silicon grains of a hemispherical silicon grain (HSG silicon) layer for an integrated capacitor electrode. The method comprises dry etching the HSG silicon layer prior to formation of a capacitor dielectric.

In accordance with yet another aspect of the present invention, a method is provided for fabricating a capacitor for an integrated circuit memory cell. The method comprises forming a conductive container, having a diameter of less than about 7,000 Å, lined with an interior hemispherical grained (HSG) textured layer. Less than about 250 Å of the interior HSG layer is removed by dry etch. Thereafter, a substantially conformal capacitor dielectric is formed over the interior HSG layer and a top electrode is formed over the capacitor dielectric.

Preferred embodiments are disclosed in which the dry etch comprises either a vapor etch or a plasma etch. The particular vapor etch disclosed comprises an HCl/HF vapor etch, while the particular plasma etch comprises an $NF_3$/Ar plasma etch. Either etch may be isotropic, while the plasma may also be anisotropic. The dry etch may be controlled within precise limits to avoid overetching.

DETAILED DESCRIPTION OF THE PREFERRED EMBODIMENT

Although the present description focuses on the context of a DRAM cell, it will be understood that the present invention may have utility in any application where a uniformly thick layer is desired over a layer having rough or high surface area. The invention has particular utility for stacked capacitors incorporated into highly dense memory chips.

Figure 4:
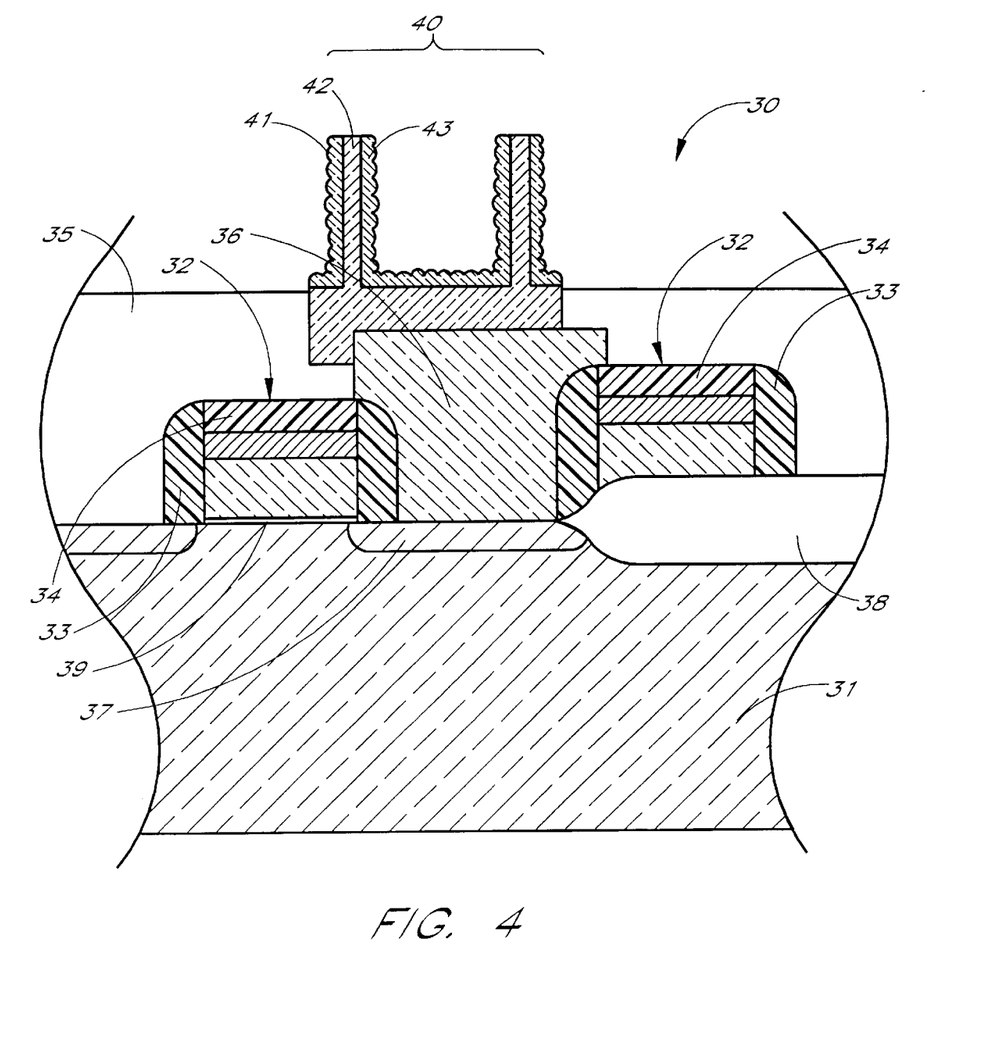
FIGS. 4–8 illustrate generally a process of forming an integrated capacitor incorporating a uniformly thick dielectric layer over an HSG silicon layer, in accordance with preferred embodiments of the present invention.

FIG. 4 illustrates a partially fabricated DRAM memory cell 30 formed over a semiconductor substrate 31, in accordance with preferred embodiments of the present invention. A pair of word lines 32 are shown isolated by a plurality of vertical dielectric spacers 33, word line insulating caps 34 and a planarized insulating layer 35. A contact plug 36 forms electrical contact with an active area 37 between the word lines 32. The word lines 32 each overlie either a relatively thick field oxide 38 or a much thinner gate oxide 39. A bottom electrode is defined in electrical contact with the contact plug 36, the preferred bottom electrode taking the form of a container structure 40 superjacent the plug 36.

The memory cell 30 of the preferred embodiments is constructed by the general process sequence disclosed in U.S. Pat. No. 5,340,765, issued Aug. 23, 1994 to Dennison et al. It will be understood, however, that the container 40 of the preferred embodiments may be replaced with other bottom electrode configurations. The invention has particular utility for stacked capacitor structures, such as those disclosed in U.S. Pat. No. 5,234,355, issued to Rhodes et al. (stacked comb spacer capacitor); U.S. Pat. No. 5,236,860, issued to Fazan et al. (lateral extension capacitor); and U.S. Pat. No. 5,340,763, issued to Dennison (multiple. pins within container and container-within-container capacitor).

The preferred embodiments are adapted to extremely dense integrated circuits, such as 64 Mbit DRAM arrays, wherein circuit dimensions may be less than 0.7 μm. Dimensions of the preferred memory cell 30 are scaled down accordingly, relative to previous generations. For example, the preferred container 40 has a diameter between about 1 μm (micron) and 0.3 μm, and most preferably less than about 0.7 μm. The height of the container 40 is preferably between about 1.5 μm and 3 μm, and most preferably about 2.0 μm.

The container 40 may comprise any of a number of conductive materials, including but not limited to silicon, refractory metal suicides and metals, and includes a hemispherical grained (HSG) texture over at least part of the container 40 surface. The preferred container 40 comprises silicon, most preferably including an outer HSG silicon layer 41, a polysilicon layer 42, and an inner HSG silicon layer 43. The polysilicon layer 42 should be in-situ doped (e.g., with phosphine) for conductivity. The resultant bottom electrode may then utilize both outer and inner texturized surfaces for charge storage during circuit operation. It will be understood that, for alternative embodiments, the bottom electrode may comprise only a single HSG layer, and that the HSG layer may be formed in direct contact with a conductive plug or other circuit node.

The HSG silicon layers, 41 and 43, may be formed by any process known in the art of integrated circuit fabrication. Most preferably, however, layers of amorphous silicon sandwich the polysilicon layer 42 and are subjected to a vacuum anneal, causing a redistribution of silicon atoms in each amorphous silicon layer. U.S. Pat. No. 5,407,534, issued to Thakur and assigned to the assignee of the present invention, discloses such a texturizing vacuum anneal. The disclosure of this patent is hereby incorporated by reference.

A layer of amorphous silicon is formed on either side of the polysilicon 42 to a preferred thickness between about 500 Å and 1,500 Å, most preferably about 1,000 Å. The structure is preferably conductively doped and then heated to a temperature in the range of between 450° C. and 800°

C., more preferably between about 560° C. and 620° C., most preferably around 600° C., while the chamber pressure is maintained between about $1\times10^{-10}$ Torr and $1\times10^{-3}$ Torr. A fluorine-based gas (e.g., $NF_3$, $CF_4$, or $C_2F_6Cl_2$), diluted with an inert gas (e.g., argon), is bled into the anneal chamber. The surface migration of the silicon atoms to the nucleation sites results in the formation of a rough or texturized, granular surface. The HSG silicon layers 41 and 43 created by the preferred process each have a thickness between about 500 Å and 1,500 Å, and most preferably about 1,000 Å. Together with the polysilicon layer 42, these layers produce a total thickness for the walls of the container 40 between about 1.000 Å and 3,000 Å.

The resulting container 40, including the inner HSG silicon 41 and outer HSG silicon 43, forms the bottom or storage electrode of the memory cell 30 capacitor. Accordingly, in order to provide reasonable conductivity, the HSG silicon layers 41 and 43 may also be lightly doped with n-type dopants. Alternatively, the central polysilicon layer 42, which was doped in-situ, may serve as the dopant for all three silicon layers.

Figure 5:
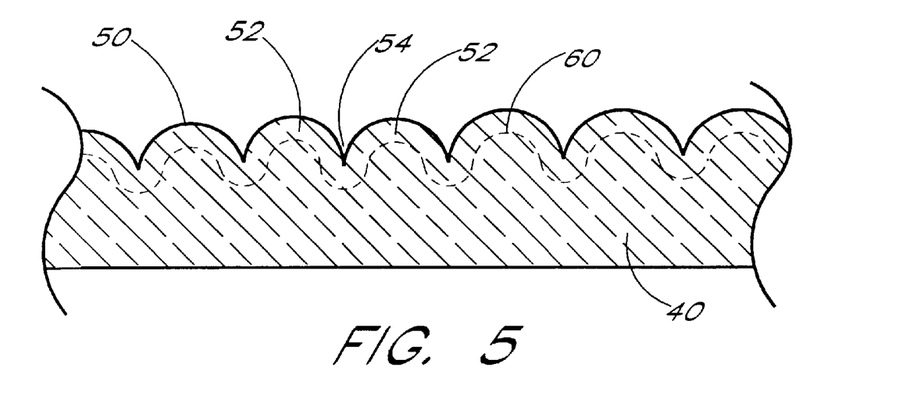

FIG. 5 is an enlarged cross-section of a surface 50 of the container, including an HSG silicon layer 41 or 43 merged with the underlying polysilicon layer 42. The illustrated section may represent either the outer HSG silicon 41 or the inner HSG silicon 43 seen in FIG. 4. As illustrated, the surface 50 resembles rounded hillocks and provides considerably greater surface for charge storage, as compared to planar electrodes. Individual silicon grains 52 of the HSG silicon 41 or 43 tend to intersect one another, creating narrow crevices 54 at boundaries. As described in the "Background" section above, these crevices 54 ordinarily result in non-uniformities in the thickness of a capacitor dielectric to be deposited over the surface 50 of the conductive container 40, and consequently lower capacitance.

The present invention provides a method of separating individual silicon grains 52, thereby widening the crevices 54 between grains 52. The dotted reference line in FIG. 5, for example, represents a modified surface 60 of the container 40 following an etch step in accordance with preferred embodiments of the present invention.

As disclosed in the co-pending U.S. Patent Application of Figura, entitled "A Method for Increasing Capacitance of an HSG Rugged Capacitor Using A Post Deposition Wet Etch," Ser. No. 08/209,661, filed Mar. 11, 1994, and in the related co-pending U.S. Patent Application of Figura, entitled "A Method For Increasing Capacitance of an HSG Rugged Capacitor Using A Phosphine Rich Oxidation and Subsequent Wet Etch", Ser. No. 08/209,659, filed Mar. 11, 1994, increasing separation of HSG silicon grains reduces dielectric bridging between grains. Both of these pending applications are assigned to the assignee of the present invention, and are hereby incorporated by reference. A more uniformly thick dielectric layer may thus be deposited over the bottom electrode. This, in turn, results in an increased overall capacitance by allowing deposition of the minimal dielectric thickness which is still adequate to avoid most pinhole and tunneling leakage problems.

Although wet etching of HSG silicon is an inexpensive, effective method of increasing. capacitance for current integrated circuit density, precise control of etch rates is difficult. Even after removal from an etch bath, residual etchant must be rinsed away with deionized water and the wafer needs to be spun dry. Additionally, due to surface tension of a dilute etchant, wet etches may not be able to etch the narrow crevices 54 as quickly as the tops of silicon grains 52. A consequently nonuniform etch tends to level the HSG texture, reducing electrode surface area. Nonuniformity of the etch is exacerbated by having to punch through native oxide formed during transfer from the anneal chamber to the wet etch bath. Thus, in order to achieve a separation of silicon grains adequate to allow uniform dielectric deposition thereupon, wet etch may require removing an average of 100 Å to 500 Å of silicon or oxide, and even more removal may result from the lack of control over the rate of etch., Exposed circuit structures are therefore subject to significant change in their dimensions.

For more dense circuitry, such as that of the preferred embodiments herein, such reduction of structural dimensions may lead to critical damage. After wet etch treatment for separation of silicon grains 52, this dimension may be reduced by as much as 1,000 Å or even higher (since the walls of the container 40 are etched from both sides), further risking breakage of already delicate structures. Wet etch also entails a greater risk of causing shorts and bridges (through undercutting other device structures in the chip) where utilized in conjunction with higher density circuits. Post-wet etch rinse and spin-dry may also damage circuit structures. Other exposed structures may include interconnects, depending upon the process flow, and excessive thinning of interconnect could lead to intolerably high interconnect resistance.

The present invention therefore utilizes a dry etch process for separating silicon grains. The dry etch tends to reach into narrow crevices 54 between grains 52 more easily than wet etch, permitting a quicker separation etch and correspondingly less damage to structures which should not be etched. Dry etch may also be controlled within very tight limits, thus allowing precise etch rate and avoiding overetch after adequate separation has been achieved. Furthermore dry etch in general provides the ability to control etch directionality. Like wet etch, dry etch (such as vapor etches) may be isotropic. On the other hand, dry etch may be chosen to provide anisotropic etching (e.g., single frequency plasma etch) where desired, employing variable degrees of lateral and vertical etch. Additional advantages of dry etch stem from reduced contamination of materials exposed to the etch, elimination of the need for damaging rinse and spin-dry steps, and the possibility of performing dry etch in-situ following HSG silicon formation.

Figure 6:
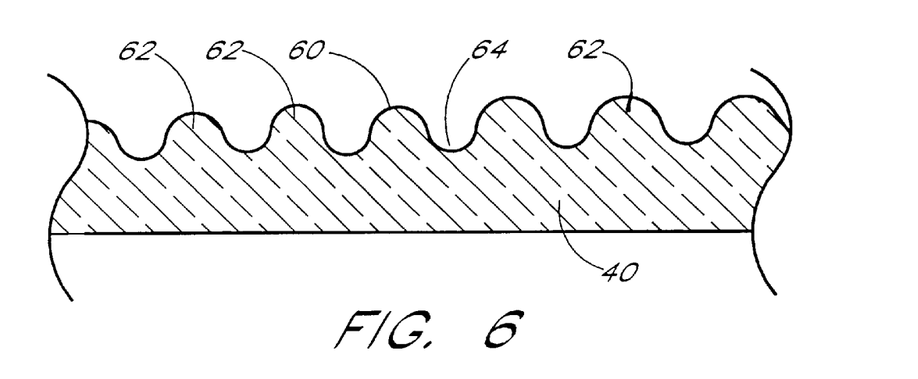
Figure 7:
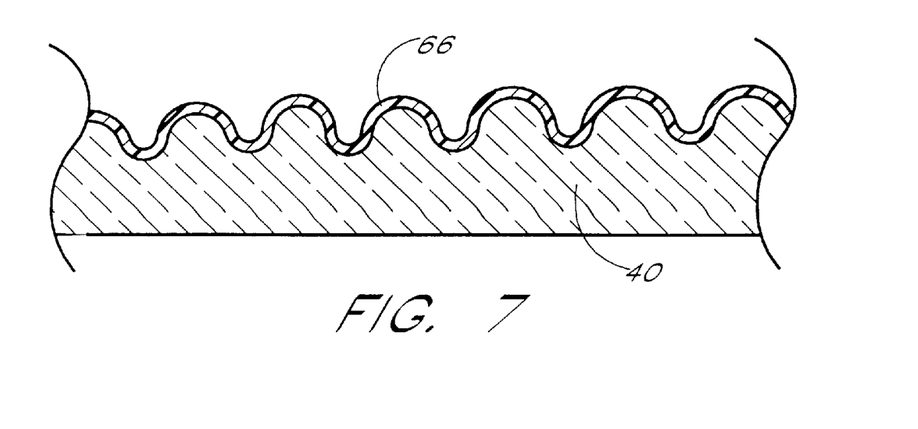

FIGS. 6 and 7 illustrate the result of a dry HSG silicon etch, in accordance with preferred embodiments of the present invention. In accordance with a first preferred embodiment, the HSG surface 50 is treated with a vapor etch to separate the individual grains 52 and widen the inter-grain crevices 54, seen in FIG. 5. The vapor chemical should etch the entire silicon surface 50 evenly, including top surfaces of the grains 52 and the crevices 54, although alternative embodiments may be adjusted for anisotropic etch. The first embodiment utilizes a vapor form of hydrofluoric acid (HF) to accomplish this etch. Unlike wet (liquid) etch, HF vapor may reach into small spaces such as the intergrain crevices 54. HF may clean any native oxide which may form over the HSG silicon surface 50. Accordingly, the HF etch of the first preferred embodiment may be employed in-situ (within the chamber in which HSG silicon is formed) or ex-situ. Preferably, temperature is maintained between 0° C. and 100° C. for this embodiment, and most preferably about 30° C. Pressure should be maintained between about 100 mTorr and about 1,000 mTorr.

The vapor etch of the first embodiment further includes a later step of etching the silicon of the HSG surface 50 with a vapor form of hydrochloric acid (HCl). Preferably, temperature is maintained between 100° C. and 800° C. for this embodiment, and most preferably about 600° C. The container 40 should be etched under these conditions for between about 10 seconds and 60 seconds, and most preferably about 20 seconds.

FIG. 6 illustrates the container 40 after the etch in accordance with the first preferred embodiment. The modified surface 60 is recessed from the unetched surface 50 (FIG. 5) by the amount of silicon etched. For the preferred container 40 dimensions, between about 20 Å and 500 Å, more preferably less than about 200 Å, and most preferably about 100 Å of silicon has been removed by the vapor etch. It will be understood by the skilled artisan, of course, that more or less may be etched (by varying the time of exposure to the vapor etch) according to tolerances of the capacitor design. Smaller individual grains 62 are left, but the total surface area remains relatively constant since deeper troughs 64 are left in place of the crevices 54 (FIG. 5). The troughs 64 are also widened relative to the crevices (54), as illustrated.

Referring to FIG. 7, the etched surface 60 of FIG. 6 is shown after deposition of a uniformly thick dielectric layer 66. Due to the separation etch of the first embodiment, the dielectric layer 66 may be deposited to a uniform thickness over the smaller grains 62 and into the widened troughs 64. Accordingly the minimal dielectric thickness, consistent with considerations of tunneling and pinhole leakage, may be formed over the entire modified surface 66 of the container 40. For example, in the preferred embodiments, the dielectric 66 comprises silicon nitride having a thickness between about 50 Å and 200 Å, more preferably between about 50 Å and 70 Å, and most preferably about 60 Å. The dielectric 66 is preferably formed by known chemical vapor deposition (CVD) processes, thus ensuring highly uniform deposition.

In accordance with a second preferred embodiment of the present invention, the separation etch step comprises a plasma etch. As with the first preferred embodiment, the plasma etch comprises a dry silicon etch. Unlike the first embodiment, the plasma etch may be anisotropic and tailored to a desired directionality or proportions of vertical and lateral etch. Most preferably, however, the plasma etch of the second embodiment is isotropic, producing the same etch profile 60 as illustrated in FIG. 6. The plasma etch may be achieved, for example, by etching in a dual frequency plasma reactor, employing two cathodes alternating electric fields at different frequencies. A resultant high density plasma attacks all silicon surfaces evenly. Alternatively, isotropic etch may be accomplished by varying pressure parameters and by varying the length of power "off" time for an intermittent pulsed electric field, as disclosed in U.S. Pat. No. 5,160,408, issued Nov. 3, 1992 to Long and assigned to the assignee of the present invention. The disclosure of this patent is hereby incorporated by reference.

Preferably, the plasma gas comprises a fluorine gas and an inert carrier gas, most preferably $NF_3$ and argon, in a dual frequency plasma etch reactor, while the wafer itself serves as a common ground. $NF_3$ comprises between 0% and 100% of the gas volume, more preferably between about 5% and 40%, and most preferably about 20%. For example, the $NF_3$ flow may comprise about 30 sccm, depending upon reactor volume. RF power for each channel is maintained between about 50 W and 1,000 W, more preferably between about 100 W and 500 W, and most preferably about 200 W, while the two cathodes alternate at 13.5 MHz and 400 kHz. Pressure should be maintained between about 1 mTorr and about 500 mTorr, more preferably between about 5 mTorr and 20 mTorr. The etch should be performed in-situ to avoid formation of native oxide, and should be performed for between about 10 seconds and 100 seconds, and most preferably about 20 seconds.

The parameters for the plasma etch of the second embodiment are set to provide isotropic etching of between about 20 Å and 500 Å, and most preferably about 100 Å, similar to the result of vapor etching in accordance with the first embodiment. FIG. 6 thus represents modified surface 60 of the container 40 produced by either of the described embodiments. In either case, a uniformly thick dielectric 66 is deposited over the etched surface 60, as shown in FIG. 7, serving as the capacitor dielectric.

Figure 8:
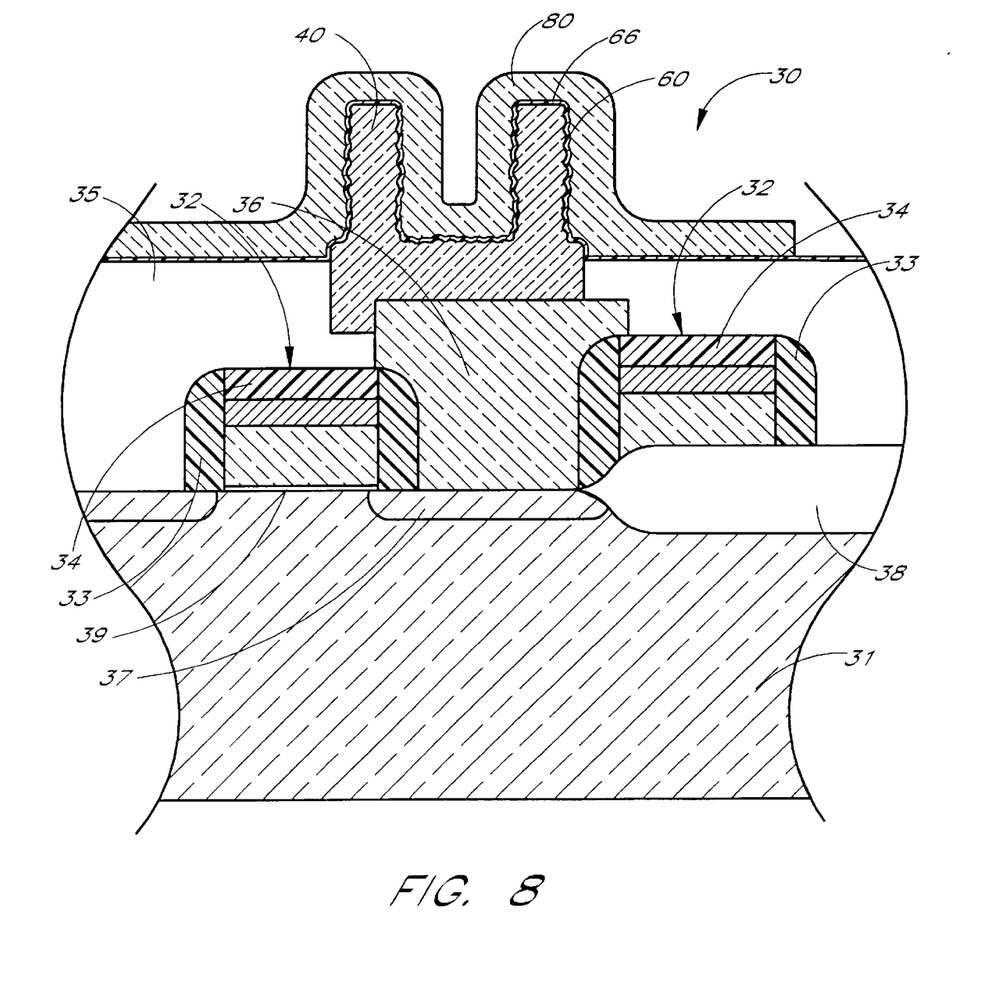

Referring now to FIG. 8, the container 40 is illustrated after a top electrode 80 has been deposited over the conformal dielectric layer 66, thus completing the capacitor for the memory cell 30. The top electrode 80 comprises a conductive material such as polysilicon. Although illustrated as patterned, the top electrode 80 may also take the form of a common reference electrode for the DRAM array. From this point, the DRAM array may be completed by conventional fabrication processes.

It will be understood from the description set forth above that the present invention provides a method for increasing capacitance of an integrated circuit capacitor. In particular, individual grains of a hemispherical grained silicon layer may be separated, by means of the described method, prior to formation of the capacitor dielectric. At the same time, the method is controllable such that critical dimensions of circuit structures are not overetched. Further advantages of the present invention include versatility, optional directional etching, lowered risk of contamination and consequent data errors or circuit failure, and the elimination of a rinse and spin-dry step ordinarily following wet etches. Overall reliability of the memory cells created by processes incorporating the present invention may be markedly improved, particularly for densely packed circuits such as 64 Mbit DRAMs and beyond.

Although the foregoing invention has been described in terms of certain preferred embodiments, other embodiments will become apparent to those of ordinary skill in the art, in view of the disclosure herein. Accordingly, the present invention is not intended to be limited by the recitation of preferred embodiments, but is instead intended to be defined solely by reference to the appended claims.

We claim:

1. A method of fabricating a capacitor for an integrated circuit memory cell, the method comprising:

forming a layer of hemispherical grained (HSG) silicon for a bottom electrode structure in electrical contact with a circuit node; and dry etching the HSG silicon layer by flowing hydrofluoric vapor, thereby increasing separation between individual grains of the HSG silicon layer.

2. The method of claim 1, wherein dry etching comprises performing a substantially isotropic silicon etch.

3. The method of claim 1, wherein the dry etching further comprises flowing hydrochloric vapor.

4. The method of claim 4, wherein dry etching comprises:

etching with hydrofluoric vapor between about 0° C. and 100° C., at between about 100 mTorr and 1,000 mTorr; and etching with hydrochloric vapor between about 100° C. and 800° C., for between about 10 seconds and 60 seconds.

5. A method of fabricating a capacitor for an integrated circuit memory cell, the method comprising:

growing a layer of hemispherical grained (HSG) silicon for a bottom electrode structure in electrical contact with a circuit node, wherein growing comprises a redistribution anneal: and separating individual grains of the HSG silicon layer by exposing the HSG silicon to a substantially isotropic plasma etch within a plasma reactor.

6. The method of claim 5, wherein the plasma reactor comprises a dual frequency, high density plasma reactor.

7. The method of claim 5, wherein the plasma etch comprises flowing a fluorine-containing gas and an inert carrier gas.

8. The method of claim 7, wherein the fluorine-containing gas comprises $NF_3$ and the inert carrier gas comprises argon.

9. The method of claim 8, wherein the $NF_3$ comprises between about 5% and 40% of a total gas volume.

10. The method of claim 9, wherein an RF power is set between about 100 W and 500 W, and a reactor pressure is set between about 1 mTorr and 500 mTorr.

11. The method of claim 1, wherein the bottom electrode structure comprises a container.

12. The method of claim 11, wherein the bottom electrode is characterized by a diameter of less than about 1.0 μm.

13. The method of claim 12, wherein the bottom electrode comprises sidewalls including at least one HSG silicon layer, the sidewalls having a thickness of less than about 3,000 Å, and the dry etching step comprises etching less than about 200 Å of the HSG silicon layer.

14. The method of claim 1, wherein dry etching comprises etching between about 20 Å and 500 Å of the HSG silicon layer.

15. The method of claim 1, further comprising:

forming a substantially conformal capacitor dielectric layer over the dry etched hemispherical grained silicon layer; and depositing a top electrode over the capacitor dielectric.

16. The method of claim 15, wherein the capacitor dielectric comprises silicon nitride having a thickness between about 50 Å and 70 Å.

17. The method of claim 1, wherein the step of forming HSG silicon comprises depositing an amorphous silicon layer in electrical contact with the circuit node and vacuum annealing the amorphous silicon.

18. A method of separating substantially contiguous silicon grains of a hemispherical silicon grain (HSG silicon) layer for an integrated capacitor electrode, the method comprising substantially isotropically dry etching between about 20 Å and 500 Å of the HSG silicon layer prior to formation of a capacitor dielectric.

19. A method of fabricating a capacitor for an integrated circuit memory cell, the method comprising:

forming a conductive container lined with an interior hemispherical grained (HSG) texture, the container characterized by a diameter of less than about 1.0 μm;

dry etching less than about 200 Å of the interior HSG texture layer by exposure to a fluorine-containing species;

forming a substantially conformal capacitor dielectric layer over the etched interior HSG texture; and depositing a top electrode over the capacitor dielectric.

20. The method of claim 19, wherein dry etching further comprises etching an exterior HSG texture.

21. The method of claim 19, wherein the fluorine-containing species comprises HF vapor.

22. The method of claim 19, wherein the fluorine-containing species comprises a plasma product.

23. The method of claim 22, wherein the plasma product is formed by disassociation of $NF_3$ gas.

24. A process of forming an integrated circuit, the process comprising:

forming an electrode structure including a plurality of contiguous hemispherical silicon grains; and separating the contiguous hemispherical grains by etching with HF vapor between about 0° C. and 100° C. and HCl vapor between about 100° C. and 800° C.

25. A method of forming a capacitor structure in a dynamic random access memory array, the method comprising:

forming a conductive bottom electrode including a hemispherical grain silicon surface;

substantially uniformly etching less than about 200 Å of the hemispherical grain silicon surface by exposure to a plasma formed of source gases including an inert gas and between about 5% and 40% $NF_3$ by volume, thereby leaving an etched surface;

depositing a capacitor dielectric over the etched surface; and depositing a conductive top electrode layer over the capacitor dielectric.

26. The method of claim 25, wherein the capacitor dielectric has a substantially uniform thickness over the etched surface of between about 50 Å and 200 Å.

27. The method of claim 25, wherein the capacitor dielectric has a substantially uniform thickness over the etched surface of between about 50 Å and 70 Å.

* * * * *